United States Patent
Adams et al.

(10) Patent No.: US 10,605,989 B2
(45) Date of Patent: Mar. 31, 2020

(54) METHOD OF MANUFACTURING AN INTEGRATED SEMICONDUCTOR OPTICAL WAVEGUIDING DEVICE

(71) Applicant: Finisar Sweden AB, Järfälla (SE)

(72) Inventors: David Adams, Stockholm (SE); Martin Anders Isak Stattin, Järfälla (SE); Christopher Daunt, Solna (SE)

(73) Assignee: Finisar Sweden AB, Jarfalla (SD)

( * ) Notice: Subject to any disclaimer, the term of this patent is extended or adjusted under 35 U.S.C. 154(b) by 0 days.

(21) Appl. No.: 16/354,414

(22) Filed: Mar. 15, 2019

(65) Prior Publication Data
US 2019/0285801 A1   Sep. 19, 2019

Related U.S. Application Data

(60) Provisional application No. 62/643,990, filed on Mar. 16, 2018.

(51) Int. Cl.
*G02B 6/136* (2006.01)
*G02B 6/12* (2006.01)
*H01L 27/146* (2006.01)
*H01L 31/0304* (2006.01)

(52) U.S. Cl.
CPC .... *G02B 6/136* (2013.01); *G02B 2006/12078* (2013.01); *G02B 2006/12097* (2013.01); *H01L 27/14685* (2013.01); *H01L 31/03046* (2013.01)

(58) Field of Classification Search
None
See application file for complete search history.

(56) References Cited

U.S. PATENT DOCUMENTS

| | | | | | |
|---|---|---|---|---|---|
| 7,043,111 | B2* | 5/2006 | Ikarashi | ............ | G02B 6/12004 385/14 |
| 7,713,767 | B2* | 5/2010 | Chan | ..................... | G02B 6/132 257/E21.598 |
| 8,900,899 | B2* | 12/2014 | Rabiei | ..................... | G02B 6/13 257/382 |
| 9,494,734 | B1* | 11/2016 | Jain | ..................... | G02F 1/01708 |

* cited by examiner

*Primary Examiner* — Chandra Chaudhari
(74) *Attorney, Agent, or Firm* — Maschoff Brennan; Paul G. Johnson (57) ABSTRACT

A method of manufacturing an integrated semiconductor optical waveguiding device comprising an elongated waveguide, the method comprising:
providing a material stack comprising a substrate layer, an anisotropically wet etchable conductive layer, a waveguiding core layer, an etch-guiding layer between the substrate layer and the waveguiding core layer, and InP material between the etch-guiding layer and the waveguiding core layer;
etching said material stack down to and including said waveguiding core layer, to form an elongated shape of the elongated waveguide together with an etched area laterally beside the waveguide;
providing an etch mask material across the formed waveguide; and
wet etching parts of said etched areas that are not protected by the etch mask, to remove material of the etch-guiding layer across a lateral direction of the waveguide, forming a laterally extending through tunnel in the etch-guiding layer and in the conductive layer.

25 Claims, 10 Drawing Sheets

METHOD OF MANUFACTURING AN INTEGRATED SEMICONDUCTOR OPTICAL WAVEGUIDING DEVICE

The present invention relates to a method of manufacturing an integrated semiconductor optical waveguiding device.

As used herein, the term "monolithic" refers to a material structure which may comprise several different materials, such as layers of different materials, but which is connected in one single material body. An "integrated" device, when referring to an optical device, is intended to mean herein that such a device comprises at least two integrated components disposed on a common substrate. This is in contrast to a "discrete" device, which only has one component function. Accordingly, the fabrication onto a common substrate of two or more devices is typically referred to as a "monolithically integrated" combination of devices.

Optical waveguides are frequently used in such monolithically integrated optical devices. Such waveguides may, for instance, be formed as ridge structures that are etched on substrates, carrying light along a path that is near to the surface of the substrate.

In many waveguiding ridge structures, the ridge comprises one or several intrinsic, N-doped or P-doped waveguiding layers, as well as N-doped lower layers between these waveguiding layers and the substrate. For instance, such N-doped lower layers may be used to provide N-type electric contacts with low electric resistance. It may also be desirable for other reasons to have high electrical conductivity in such lower layers.

In many applications, however, such as in the useful combination, for the present purposes, of SOA (Semiconductor Optical Amplifier) components and in IQM-type modulators, it is desirable to achieve high electric isolation between integrated components or device segments that are joined by such an optical waveguide, without leading to excessive circuit size or excessive optical transition losses.

Such devices may be realized for example as integrated optical waveguiding devices manufactured in the per se well-known lattice-matched or nearly lattice-matched $In_xGa_{1-x}As_{1-y}P_y/InP$ or $(In_{0.47}Ga_{0.53}As)_{1-z}(In_{0.52}Al_{0.48}As)_z/InP$ material systems, where hereafter the alloy mole fractions x, y, and z will be omitted for simplicity.

In order to increase electric isolation between components along such a waveguide, it is possible to increase the longitudinal length of the waveguide in question. However, this leads to larger circuits, additional optical loss and other problems.

Another way to increase longitudinal waveguide isolation is to reduce the conductivity of N-doped layers situated beneath the waveguiding layers, using diffused P-doping in such N-doped layers. However, due to the heavy N-doping used in such lower layers in practical applications, such as in integrated IQM-SOA circuits, such P-dopant diffusion has turned out to often be insufficient.

Also, it is known to produce opto-electronic circuits whose components must be electrically isolated from each other by fabricating such circuits on highly resistive substrates. Then, a stack of electrically conductive or undoped semiconductor layers are grown on the resistive substrate, after which an etching is performed that penetrates through all grown electrically conductive layers, down into the substrate, to form boundaries around each isolated circuit component.

Still yet another known solution is to first grow a combination of semi-insulating areas and N-doped areas onto a semi-insulating substrate surface prior to the growth of waveguiding and other layers above these. However, this approach requires additional epitaxial steps, and it results in a surface topography for the growth of the subsequent layers that is not perfectly planar, which may diminish the quality of the completed circuit.

The present invention solves these and other problems.

Hence, the invention relates to a method of manufacturing an integrated semiconductor optical waveguiding device comprising an elongated waveguide in turn having a longitudinal, a lateral, and a height direction, which waveguiding device further comprises, in height order, a lower InP substrate layer with an electric resistivity of at least 10% that of undoped InP; a conductive layer; and a waveguiding core layer, which conductive layer is doped so that it is provided with an electric conductivity that is at least 10 times higher than that of the substrate layer, and which conductive layer is arranged between the substrate layer and the waveguiding core layer, which method comprises the steps of a) providing a material stack, as a set of alloys in the InGaAsP/InP or InGaAlAs/InP material systems, and further comprising the substrate layer, the conductive layer and the waveguiding core layer, which conductive layer is made from a material which, due to its crystal properties and in relation to its crystal axes, can be more easily wet etched in certain directions than in other directions, and which conductive layer is arranged in relation to the material stack so that the conductive layer can be wet etched more easily in the height direction than in the lateral direction, which material stack further is provided to comprise, between the substrate layer and the waveguiding core layer, an etch-guiding layer made from a material which can be etched in the lateral direction more easily than what is the case for the material of the conductive layer, and which material stack comprises InP material between the etch-guiding layer and the waveguiding core layer; b) etching, in a first etching step, said material stack down to and including said waveguiding core layer, so that an elongated shape of the elongated waveguide is formed together with an etched area laterally beside the waveguide; c) providing an etch mask material across the formed waveguide; d) wet etching, in a second etching step, parts of said etched areas that are not protected by the etch mask, so that material of the etch-guiding layer as a result is removed across the lateral direction of the waveguide, forming a laterally-extended through tunnel in the etch-guiding layer and in the conductive layer.

In the following, the invention will be described in detail, with reference to exemplifying embodiments of the invention and to the enclosed drawings, wherein:

All Figures share the same reference numerals for the same or corresponding features, although reference numerals for the two main exemplary embodiments presented herein differ by their respective first digit. All FIGS. 2-10 are schematic, and are not drawn to scale nor in complete detail.

Figure 1A:
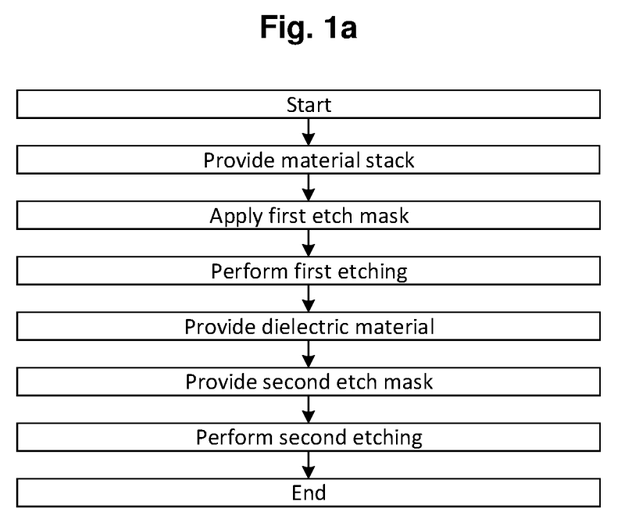
FIG. 1A is a flowchart illustrating a method according to the present invention.
Figure 8:
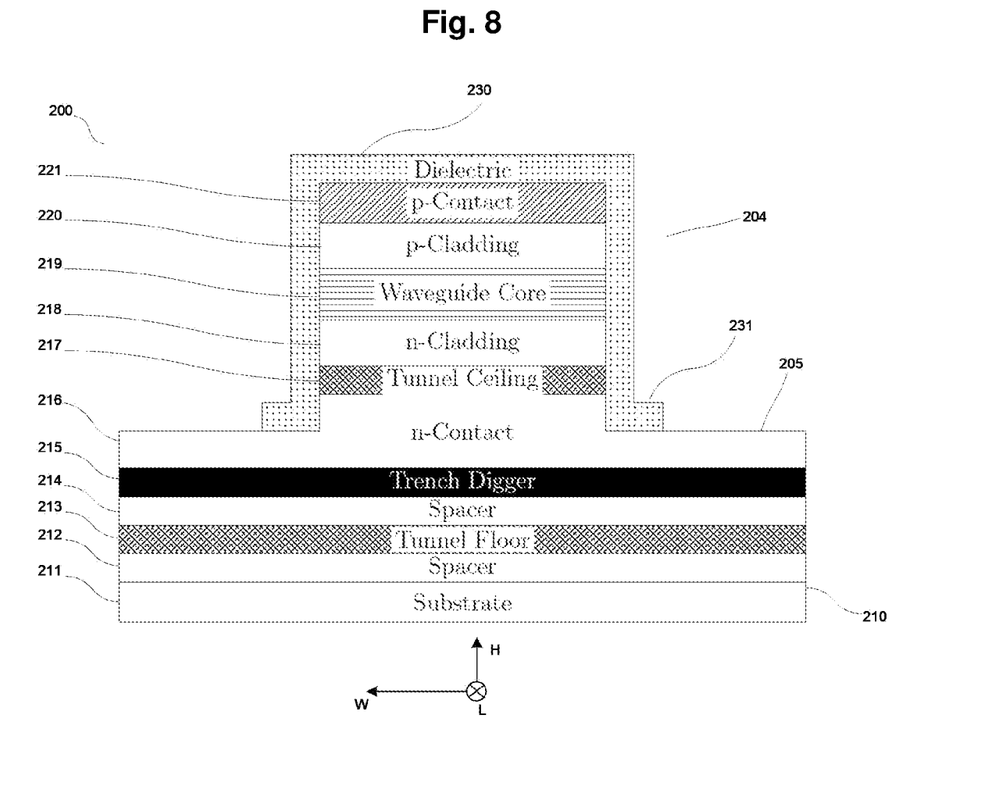
FIG. 8 shows the corresponding cross-section as shown in FIG. 3, but according to a second embodiment of the present invention.
Figure 9:
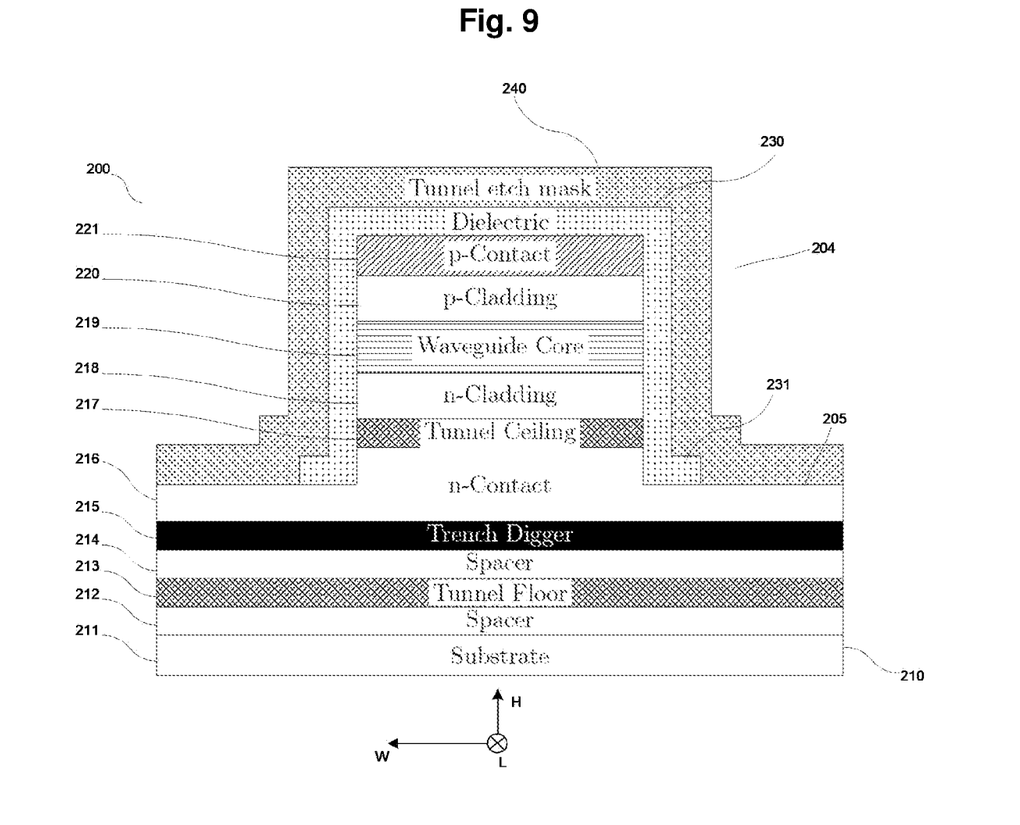
FIG. 9 shows the corresponding cross-section as shown in FIG. 4, but according to said second embodiment.
Figure 10:
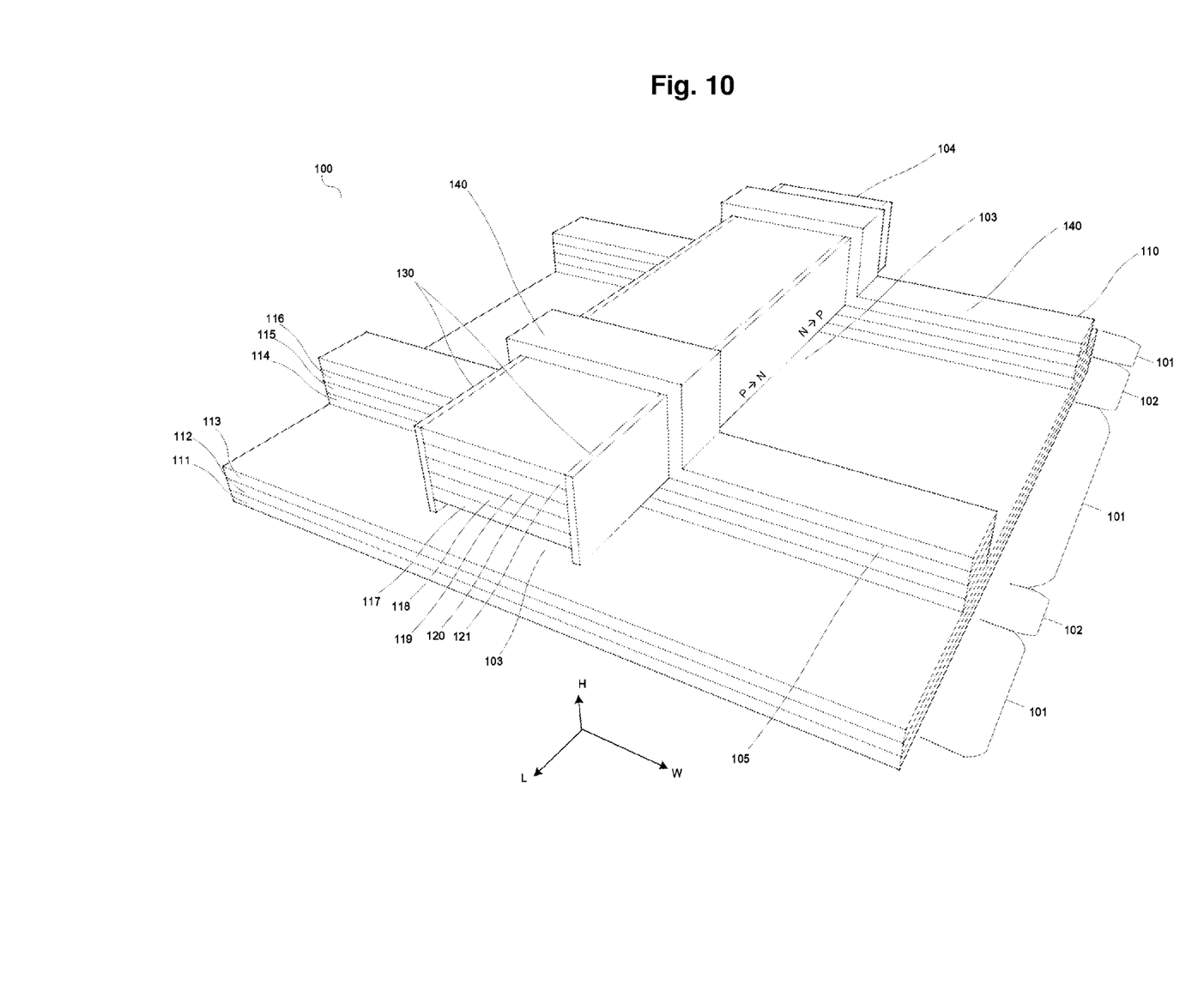
FIG. 10 shows a simplified perspective view of an integrated semiconductor optical waveguide device manufactured according to the present invention.

Hence, FIG. 1A illustrates a method according to the present invention, for manufacturing an integrated semiconductor optical waveguiding device 100, 200 of the type disclosed in various manufacturing stages in FIGS. 2-10, and in particular in FIG. 10. The semiconductor optical waveguiding device 100, 200 is preferably monolithically integrated, as explained above.

Thus, the integrated semiconductor optical waveguiding device 100 comprises an elongated waveguide 104, in turn having a longitudinal L, a lateral W, and a height H direction. The waveguide 104 is arranged to convey light along the longitudinal direction L of the device 100. The waveguide 104, and also the device 100, may be a passive, light conveying component which is integrated into a larger optical structure, such as an integrated optoelectronic circuit. In a preferred embodiment, however, the waveguide 104 is at least along part of its longitudinal elongation active in the sense that it amplifies, modulates or is otherwise actively affecting the light conveyed through it. In particular, in many types of optoelectronic circuits, waveguides 104 serve not only for optical routing, but also, within at least some portion of the circuit in question, as optically active elements, where the amplitude or phase of the light is intentionally modified in response to electrical current injection, or in response to an applied voltage, to execute some prescribed function in the operation of the circuit. This is the preferred case for the device 100. For instance, the waveguide 104 may be an active part of an interferometer or a SOA (Semiconductor Optical Amplifier). However, in such a component, it is preferred that such active parts are constrained to longitudinal sections not occupied by a through tunnel (see below).

The waveguiding device 100 further comprises, in height H order from the bottom up in the FIGS. 2-10:

A lower InP substrate layer 111 with an electric resistivity of at least 10% that of undoped InP.

At least one conductive layer 116, 118.

At least one waveguiding core layer 119.

The substrate layer 111 may be of planar configuration.

In general, N-doped layers are grown adjacent to the substrate layer 111, followed by waveguide layer(s), which may be N-type, intrinsic, or P-type. Then, P-doped cladding and top contact layers are provided. The bottom-most layers, closest to the substrate layer 111, may also comprise electric contacts, or be utilized as the surface upon which electrodes are formed to make N-type electric contacts.

The conductive layer 116, 118, or at least one conductive layer if there are several conductive layers 116, 118, is doped so that it is provided with an electric conductivity that is at least 10 times higher than that of the substrate layer 111. Moreover, the conductive layer 116, 118 is arranged between the substrate layer 111 and the waveguiding core layer 119.

The waveguide 104 may be deep clad in air or dielectric from the lateral W sides and be deep or shallow etched; alternatively the waveguide 104 can be clad on the lateral W sides to form a buried hetero-structure or buried ridge waveguide. The waveguide 104 lower cladding is typically N-type so that electrical contact can be made to the waveguide core 119. Since N-type InP is electrically highly conductive, electrical conduction along any N or N+ layers that are situated below the waveguide 119 needs to be decreased in the longitudinal direction L, that is the direction of light propagation within the waveguide 119. This is desirable from a device performance perspective.

In a first step, the method starts.

In a subsequent step, a material stack 110 is provided. The stack 110 may be provided using epitaxial growth, or in any other suitable manner. By a "stack" is herein meant a stack of integrated material layers, arranged one on top of each other. Preferably, the layers may be planar, and substantially flat and with a respective homogenous thickness. The waveguiding device 100 is then manufactured from the stack 110. It is realized that techniques such as selective area growth or selective growth enhancement may also be used to dispose layers that have unequal thickness into the final circuit. However, the thickness of each layer will typically not vary by a magnitude of more than maximally 2 or 3 times across a main plane of the stack in question.

In general, the stack 110 is provided as a set of alloys in the InGaAsP/InP material system or in the InGaAlAs/InP material system. Hence, the device 100 is an InP based device.

The stack 110 comprises the substrate layer 111, the conductive layer(s) 116, 118 and the waveguiding core layer(s) 119.

The conductive layer 116, 118, or at least one conductive layer in case there are several conductive layers 116, 118 in the stack 110, is or are made from a material which, due to its crystal properties and in relation to its crystal axes, can be more easily wet etched in certain directions than in other directions. Moreover, said conductive layer or layers 116, 118 is or are arranged in relation to the material stack 110 so that the conductive layer or layers 116, 118 can be wet etched more easily in the height direction H than in the lateral direction W.

Moreover according to the present invention, the material stack 110 comprises, between the substrate layer 111 and the waveguiding core layer 119, an etch-guiding layer 115 made from a material which can be etched in the lateral direction W more easily than what is the case for the material of the one or several conductive layers 116, 118.

The etch-guiding layer 115 may be arranged in direct contact with the one or several of the conductive layers 116, 118, such as arranged directly above, below or between such conductive layers 116, 118. For instance, the etch guiding layer 115 maybe be arranged within, or at the top or bottom of, layer 116, or, in embodiments where the core waveguide layer itself acts as a tunnel upper etch stop, then, the etch guiding layer may be arranged anywhere within either layer 116 or 118. In the same case, using the core as un upper tunnel etch stop, the core layer design would preferably be such that optical losses or scattering are not substantial when guided light passes from regions without a tunnel to regions that have a tunnel. What is important is that the etch-guiding layer 115 is used to guide the second etching process along the lateral direction W so that at least part of the conductive layer or layers 116, 118 is etched away in the below-discussed second etching step, forming a through tunnel 103. The conductive layer or layers 116, 118 may be arranged to be so thin (in the height direction H) as compared to the lateral W width of the waveguide 104 (that is, the lateral distance that must be etched in order to form the through tunnel 103) so that the second etching step would not manage to produce the through tunnel 103 without the existence of the etch-guiding layer 115, or at least so that such production would be impractical. For instance, the conductive layer or layers 116, 118 may be arranged to be so thin so that it would be impossible to produce the through tunnel in less than 2 hours for a waveguide which is at least 2 µm wide, and having an intended through tunnel height of 0.2 µm or less, without the existence of the etch-guiding layer 115.

Also, the material stack comprises InP material between the etch-guiding layer and the waveguiding core layer.

Figure 2:
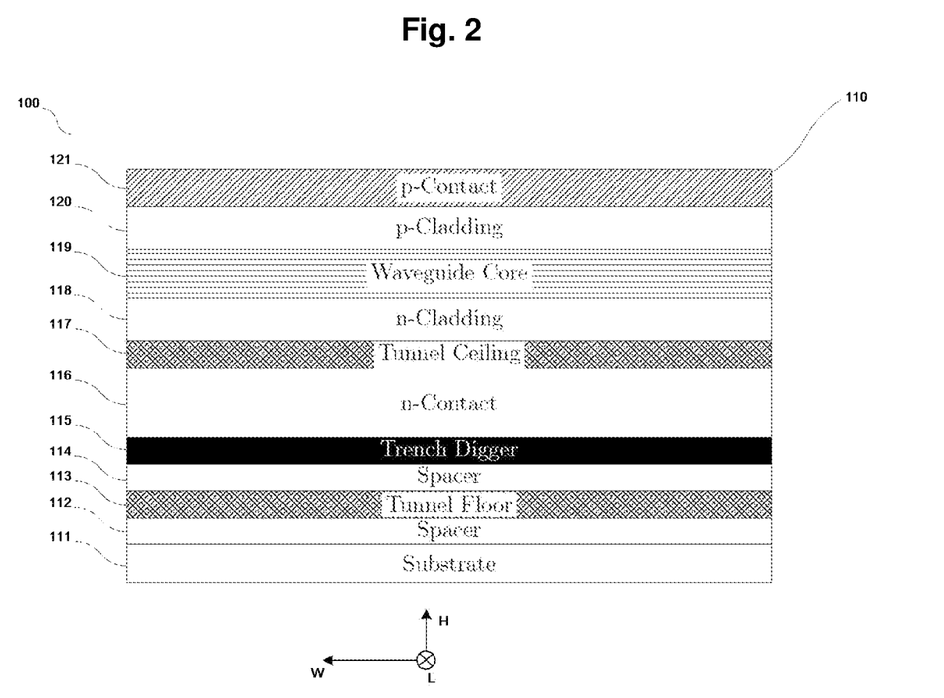
FIG. 2 shows, in cross-section perpendicularly to a longitudinal direction of a waveguide, a simplified illustration of an integrated material stack of a type used in a method according to the present invention.

The thus provided material stack 110 is illustrated in FIG. 2.

In a next step, a first etching step, the material stack 110 is etched down to and including the waveguiding core layer 119, so that an elongated shape (rib) of the elongated waveguide 104 (in the longitudinal direction L) is formed together with an etched area 105 laterally beside the waveguide 104. The etching in this first etching step may be performed along the whole length of the elongated waveguide 104 in question, not comprising any lateral support structures extending in the width direction W out from the sides of the elongated waveguide 104, providing better electric isolation. Hence, the waveguide 104 thus formed may advantageously be a deeply etched, strongly guided optical waveguide, or a waveguide component having a lateral dimension defined by the deeply etched boundaries, such as a multi mode interference (MMI) filter or coupler.

The etching in this first step can, in some embodiments, also not progress into the etch-guiding layer 115, but stop above this layer 115. More specifically, the first etching may proceed past any upper tunnel etch stop layer 117, and may stop at a height H location within a conductive layer that lies above the etch-guiding layer 115. This way, a less complex etching agent or etching apparatus may be used.

Figure 4:
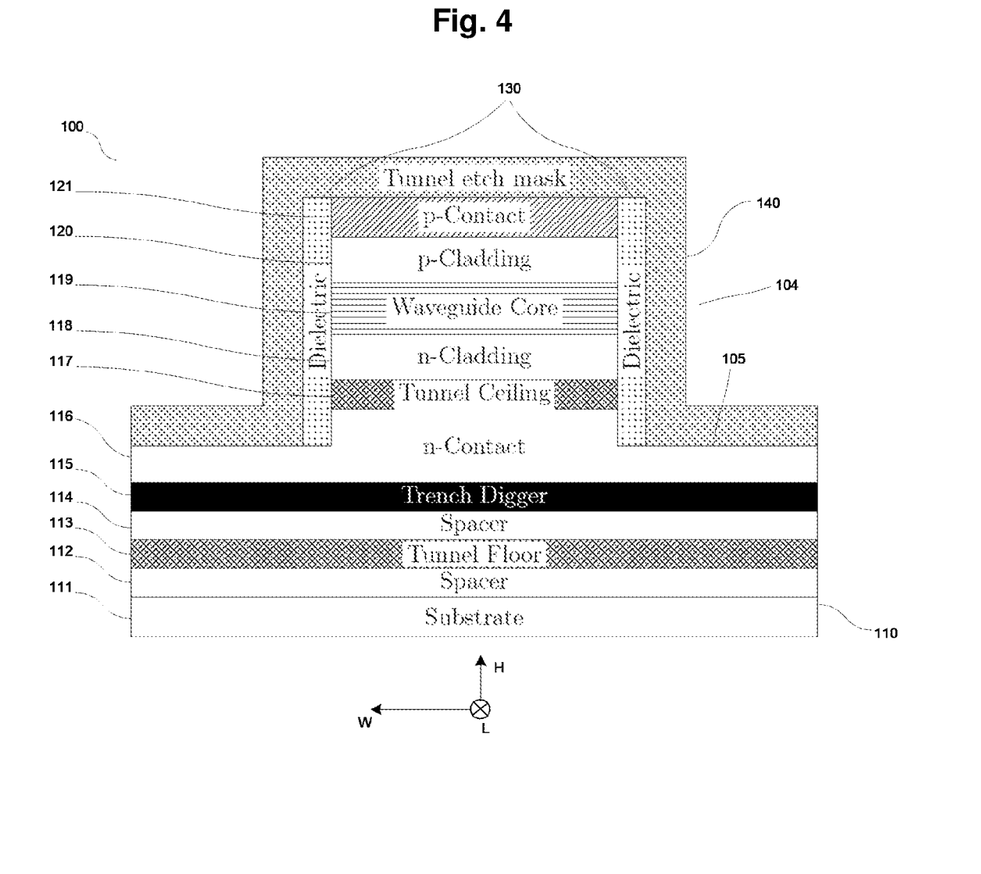
FIG. 4 shows a cross-section corresponding to that shown in FIG. 3, but at a second longitudinal location.

In a next step, an etch mask material 140, which may a deposited photoresist layer or some other protective coating layer, is provided across the formed waveguide 104. This is illustrated in FIG. 4.

Figure 5:
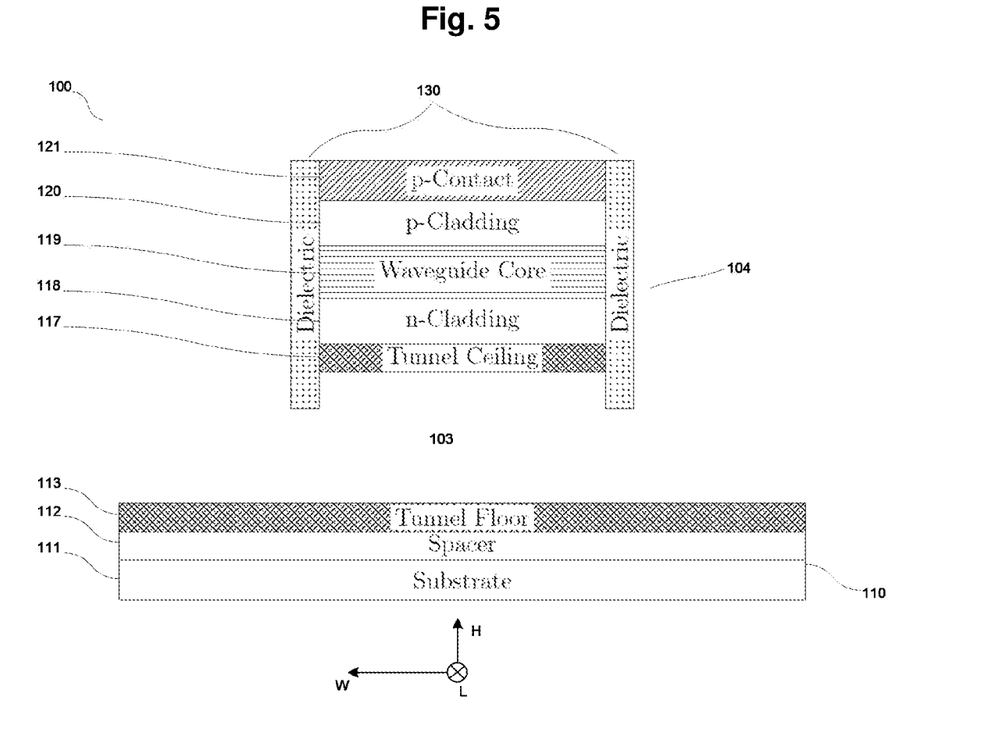
FIG. 5 shows the cross-section shown in FIG. 3, after a second etching step.

In a subsequent step, a second etching step, parts of the etched areas 105 that are not protected by the applied etch mask material 140 are wet etched away, with the result that material of the etch-guiding layer 115 as a result is removed across the lateral direction W of the waveguide 104, forming a laterally-extending-through tunnel 103 in the etch-guiding 115 and conductive layer or layers 116, 118. The result is illustrated in FIG. 5. As can be seen in FIG. 5, the second wet etching step may be performed until all or substantially all of the etch-guiding layer 115 material has been etched away, across the waveguide 104 in the lateral direction W. The corresponding material removal may also apply to one, several or all of the conductive layers. Hence, one, several or all of the conductive layers may be partly or completely removed under the waveguide 104 as a consequence of the wet etching. In the particular example shown in FIG. 5, the uppermost conductive layer 118 should not be removed as a consequence of the wet etching, since this would expose the waveguiding core 119 by the wet etch. Of course, in case the waveguide and optical circuit design are able to withstand the disturbances that are caused to the guided light when it passes to and from regions where a tunnel has been formed, such disturbances can be allowed to be formed in the waveguiding core due to the wet etching. The lower conducting layer 116 would be partially or completely etched away below the waveguide 104.

Thereafter, the method ends, possibly after any additional steps, such as an encapsulation step, a mounting step, etc., that may be conventional as such.

Such a fabrication method provides for a simple and inexpensive, yet efficient, way of producing reliable and deterministic electric isolation of two different points on one and the same integrated circuit that are connected by the waveguide 104. The tunnel 103 may be filled with air or any other non-conductive material, such as BCB (benzocyclobutene), hence providing efficient electric isolation between the substrate 101 and the waveguide 104 across the tunnel 103, and further, importantly, between different points along the waveguide 104.

An important result of such a fabrication method is the formation of a tunnel that can be situated relatively close to the waveguiding core, providing a relatively large resistance between different points along the waveguide 104 because the cross sectional area times doping product of the remaining N doped material under the waveguide is reduced by the etch removal of the highly doped N contact layer during the formation of the tunnels.

In particular, it is possible to provide the through tunnel 103 with a relatively low height H, such as between ¼ and ⅙, preferably about ⅕, of the lateral width W of the waveguide 104. This is possible since the etch-guiding layer 115 may be made very thin, as described below, while still making through etching of the conductive layer or layers 116, 118 possible. An epitaxial layer sequence designed to form a thin tunnel may require less crystal growth time than a sequence that requires the placement of a strongly optically guiding and/or absorbing etch guiding layer that must be placed far below the waveguide core. A relatively thin tunnel also reduces the etch time required prior to the wet etch tunnel formation step.

An alternative way of providing the through tunnel 103, which alternative way is not according to the present invention, would be to form an air gap below a waveguide by the wet etch removal of a relatively thick InGaAs layer. Specifically in such a case not according to the invention, the fabrication method could be designed to employ a wet etch chemistry such that the final tunnel height is substantially equal to and defined by the thickness of the InGaAs layer itself; in that case a reasonably thick InGaAs layer would be required to enable the formation of the tunnel to be completed by the wet etch in a practical length of time. In such an alternative fabrication method, a number of problems would occur, as a result of the use of an InGaAs layer below a main waveguiding layer, in all areas of the circuit in question where this InGaAs layer is not removed to form an air gap.

Firstly, InGaAs is immensely lossy (10500/cm to 12000/cm) to 1300 nm and 1550 nm band optical devices.

Secondly, InGaAs has a relatively high refractive index, that can distort the optical mode properties and propagation of the light in a main waveguide mode. This is then particularly relevant along stretches of such a waveguide where InGaAs is not removed to form such a tunnel, which may be the majority of the waveguide total length.

Thirdly, InGaAs is a very poor thermal conductor, approximately 10 times worse than InP, such that a relatively thick InGaAs layer results in a substantial increase in thermal impedance between all parts of the optical circuit that are situated above the InGaAs layer, and the substrate.

The result of these drawbacks is that the InGaAs air gap formation layer would have to be placed much further from the core waveguide than would be needed for the etch-guiding layer 115 according to the invention. Therefore, the use of InGaAs layer for airgap formation is a highly intrusive method, and as a result severely limiting by comparison with the present invention. A related possibility would be to utilize a thick InGaAsP or InGaAlAs alloy layer that is not optically absorbing at the operational wavelength of interest to form air gaps, but then the second and third problems of the InGaAs approach remain.

A thick InP buffer layer placed between the core and the InGaAs layer, or InGaAsP or InGaAlAs alloy, also increases the etch time that is required to form vertical trenches on either side of the waveguide in the fabrication step prior to the wet etch tunnel gap formation step. Furthermore, even a lightly N-doped thick InP buffer would defeat the desired electrical isolation that the present method is able to achieve.

Therefore, it is preferred not to use an InGaAs layer, or an InGaAsP, or InGaAlAs layer, having a thickness that substantially defines the entire height of the tunnel, and having a thickness that enables the completion of the wet etch tunnel formation by serving as a material layer which is etched away to form a through tunnel corresponding to the through tunnel fabricated in a method according to the present invention. In particular, it is preferred that no non-aluminium-containing InGaAsP-based material is used as a material layer which is etched away to form the through tunnel 103 according to the present invention. Instead, the fabrication method discussed above, preferably using a thin etch guiding layer surrounded by InP-based material layers, and optional tunnel etch stop layers, is used.

As illustrated in the Figures, the material stack 110 may be provided so that it further comprises an upper cladding layer 120, arranged above the waveguiding core layer 119 in the height direction H. Such an upper cladding layer 120 may be P-doped or undoped. As seen in the Figures, the upper cladding layer 120 may be provided with a top-most contact layer 121, arranged to be electrically contacted for operation of the device 100.

Moreover, the material stack 110 may be provided so that at least one of the one or several of the conductive layers 116, 118 is N-doped. Different ones of the conductive layers 116, 118 may also be N-doped, but with differently strong N-doping. This is described below.

As is illustrated in the Figures, the material stack 110 may further comprise at least one etch-stop layer 113, 117. Such an etch-stop layer 113, 117 in general defines a height-direction H etch-stop surface, a ceiling, for the wet etch, during the second etching step (above), of the one or several conductive layers 116, 118. Hence, the etch-guiding layer 115 is arranged to promote width-direction W etching of the conductive layer or layers 116, 118 beneath the waveguide core layer 119 to form the tunnel, while one or more etch-stop layers 113, 117 may be used to define the height of the through tunnel 103 in the upwards and/or downwards height direction H.

Specifically, the etch-stop layer 117 is arranged between the etch-guiding layer 115 and the waveguide core layer 119, defining an upper etch-stop surface for the wet etch of the conductive layer or layers 116, 118 in the second etching step. Such an upper etch-stop layer 117 is not strictly necessary, depending on the detailed design of the material stack 110.

However, when such an upper etch-stop layer 117 is used, it can be used to control how much of the conductive layer or layers 116, 118 that is or are removed in the second etching step.

Hence, the conductive layer or layers 116, 118 may comprise an upper conductive layer 118 with lower N doping concentration and a lower conductive layer 116 with higher N doping concentration. Then, the upper etch-stop surface 117 may be arranged between said upper 118 and said lower 116 conductive layers, defining an upper etch-stop surface between the conductive layers 116, 118 in question. This way, a highly N-doped conductive layer 116 may be etched away where the through tunnel 103 is formed, while maintaining a less highly N-doped conductive layer 118 across the through tunnel 103.

In particular, the lower conductive layer 116 may be N-doped to at least $4 \times 10^{16}$ surplus electrons per $cm^3$. The upper conductive layer 118 may be N-doped to at least 10 times less than the N-doping of the lower conductive layer 116.

The conductive layers 116, 118 and/or the core waveguide may comprise at least one layer of an InGaAlAs material. The part of the ridge structure forming the bridge span (see below regarding the bridge structure) may comprise at least one layer of an InP material. Specifically, and as stated above, the material between the etch-guiding layer 115 and the waveguiding core layer 119 comprises at least some amount of InP.

The lower etch-stop layer 113 may be used to define a lower etch-stop surface, a floor, for the wet etch in the second etching step. This confines the wet etching to the areas where the tunnel 103 is to be formed, not allowing the wet etch to go on into the substrate 111.

Both etch-stop layers 113, 117 also allow the precise definition of the through tunnel 103 dimensions, so that desired optical, electrical and mechanical properties can be imparted to the device 100 with high accuracy.

The upper etch-stop layer 117, as well as the lower etch-stop layer 113, may comprise, such as be formed from, InGaAs and/or InGaAsP.

One of the advantages provided by the present invention is to be able to form a gap 103 underneath the waveguide 104 at a selected, such as a sufficiently large, height H distance from the waveguiding core layer 119, in turn not substantially deteriorating the optical performance of the device 100. For instance, an air tunnel may be placed much closer to the waveguiding core than what would be possible when using an InGaAs layer which is relatively thick, such as at least 10% of the tunnel width, or a correspondingly thick InGaAsP or InGaAlAs layer, used in a tunnel formation approach not according to the invention.

In particular, it is possible to provide the material stack 110 so that the upper etch-stop layer 117 is arranged at least 0.1 µm in the height direction H from the waveguiding core layer 119, imparting minimum interference with the light mode guided therethrough. In general, the through tunnel 103 is preferably arranged at a height-direction H distance below the waveguide layers 119 that is enough to prevent substantial optical transition losses between the light propagating between the first 102 and second 101 parts of the circuit.

Also, the material stack 110 may be provided so that the upper etch-stop layer 117 is at the most 0.1 µm thick in the height direction H.

The etch-guiding layer 115, on the other hand, may be formed in the material stack 110 to comprise or be constituted by AlInAs and/or AlInAsP. In particular in this case, the refractive index of the etch-guiding layer 115, and at least for circuits having operation at either 1550 nm or 1300 nm optical wavelengths, is sufficiently close to that of the surrounding InP and substrate InP, so that it affords additional optical design freedoms in terms of layer placement and layer thickness as compared to, for instance, the use of thick InGaAs or InGaAsP layers not in accordance with the present invention.

In fact, the etch-stop 113, 117 and etch promotion 115 layers according to the present method may be made so thin that the optical waveguiding properties and thermal impedance properties of the core waveguide layers 119 are only minimally affected throughout the device 100.

In particular, the material stack 110 may be provided so that the etch-guiding layer 115 is at the most 0.2 μm, preferably at the most 0.1 μm, thick in the height direction H. Even such a thin etch-guiding layer 115 will provide enough wet etchant material removal velocity along the width direction so as to be able to accomplish the above described through tunnel 103.

Figure 3:
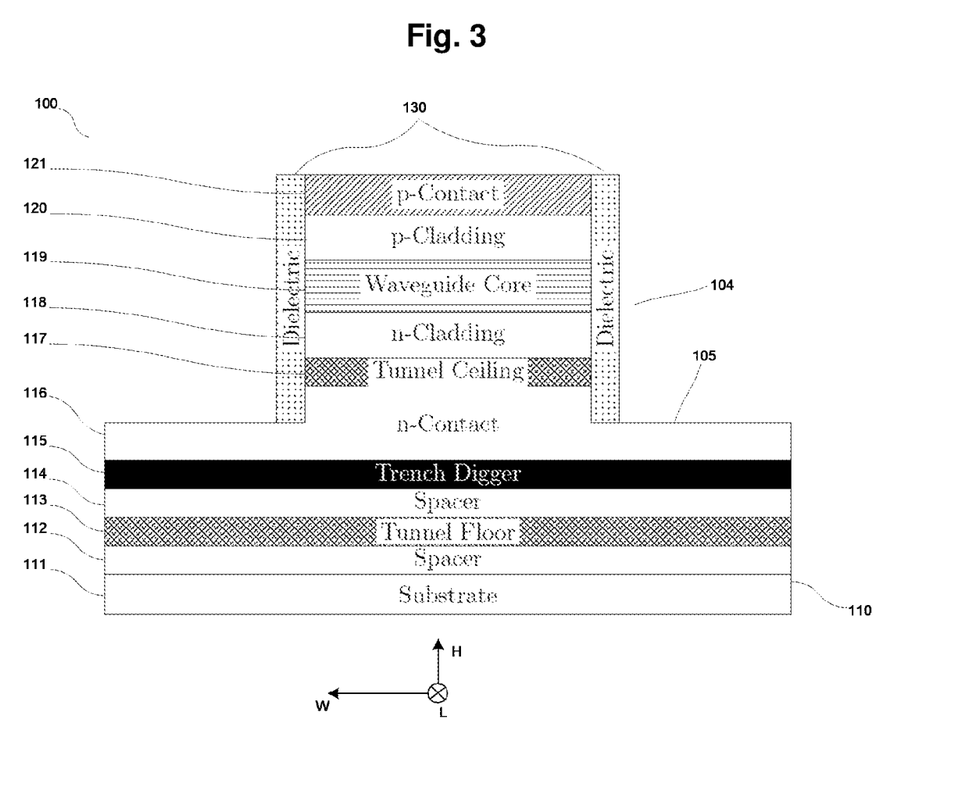
FIG. 3 shows a similar cross-section of the material stack shown in FIG. 2, at a first longitudinal location and after a first etching step.

FIGS. 3-5 further illustrate a dielectric material 130, such as SiN, or a photoresist material, which may be deposited onto the lateral W side walls of the waveguide 104 after the first etching step but before the second etching step, and in particular before the application of the etch mask for the wet etching. The dielectric or photoresist material 130 is arranged to protect the lateral W waveguide 104 side walls from being etched in the wet etching step (the second etching step). As is illustrated in FIG. 3, the dielectric or photoresist material 130 is arranged to only cover, or substantially only cover, the lateral side walls.

FIGS. 8 and 9 illustrate a second exemplifying embodiment of the present invention, of a device 200 fabricated based on a material stack 210 comprising layers 211, 212, 213, 214, 215, 216, 217, 218, 219, 220, 221 corresponding to layers 111-121 described above. In the first etching step, the etched area 205 is formed, corresponding to area 105. An etch mask 240 is used for the second etching step. However, as opposed to the dielectric or photoresist material 130 described above, which is only applied to lateral W sides of the waveguide 104, the corresponding dielectric or photoresist material 230 is applied also on the height direction H top of the waveguide 204.

As seen in FIG. 8, the dielectric or photoresist material 230 is further provided somewhat laterally W out from said waveguide 204 side wall, forming a protrusion 231. This provides optimized protection for the waveguide 204 material during the second etching step. The wet etch can reach all the way through below the waveguide 204 anyway, since it is promoted by the etch-guiding layer 215.

It is noted that the application of the dielectric or photoresist material 230 on the top of the waveguide 204 and laterally out from its sidewalls can be implemented in a mutually independent manner.

It is also noted that the dielectric or photoresist material 130, 230 may be applied substantially along the whole length of the waveguide 104, 204.

In a preferred embodiment, the above mentioned etch mask 140, however, is only provided along one or several first longitudinal parts or sections 102 along the waveguide 104, and not along second longitudinal parts or sections 101 along the waveguide 104. As a result, the through tunnel 103 is only formed along such second longitudinal sections 101.

Figure 6:
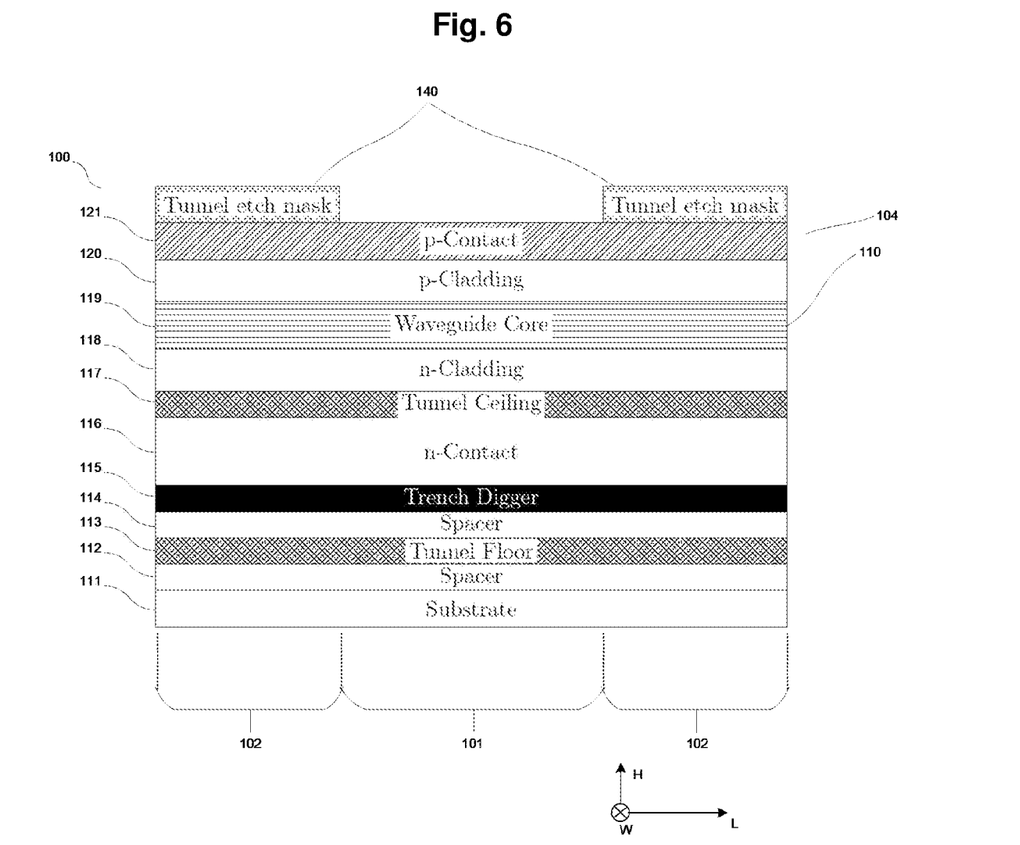
FIG. 6 shows a cross-section perpendicularly to a lateral direction of the material stack shown in FIG. 3, after the first etching step.
Figure 7:
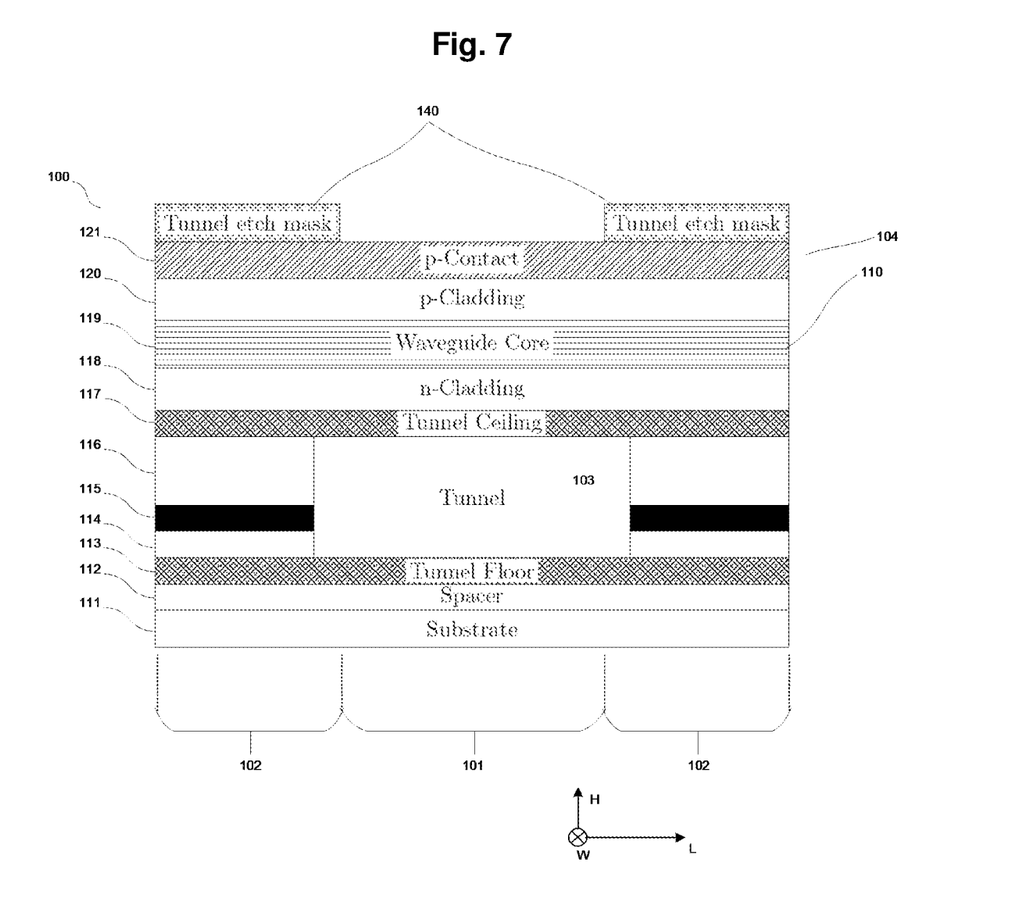
FIG. 7 shows the same cross-section as shown in FIG. 6, but after the second etching step.

This is illustrated in FIG. 3, being a cross-section at a longitudinal L location along one of said second parts 101, in comparison to FIG. 4, being a cross-section at a longitudinal L location along one of said first parts 102. This is also illustrated in FIGS. 6 and 7, showing the device 100 from its side, before and after, respectively, the wet etching step in which the through tunnel is created. Finally, the first 102 and second 101 parts are illustrated in the finished device 100 in FIG. 10, in perspective.

As is clear from these Figures, the first 102 and second 101 longitudinal parts or sections may be arranged in an alternating manner. In particular, a second longitudinal part or section 102, possibly several such second parts or sections 102, possibly even the majority or all of such parts of sections 102, may be longer, preferably at least twice as long or even 5 or 10 times longer, in the longitudinal direction L, than a respective adjacently arranged first longitudinal part or section 101. This provides a "bridge-like" structure, where the waveguide 104 runs for most of its longitudinal L length, at the second parts 101, in air or other isolating material, while a smaller portion of its length is supported by the support structure provided by the non-etched first parts 102. This provides a mechanically stable yet electrically well-isolated configuration. The first parts 102 may be 5-20 μm of longitudinal L lengths, while the second parts 101 may be 10-50 μm of longitudinal L length.

Having the general structure illustrated in FIG. 10, with second part 101 free-hanging portions supported by alternatingly arranged first part 102 support pillars, it is possible to achieve even better electric isolation, without substantially deteriorating the optical properties of the device 100, by designing the method so that it further comprises an additional diffusion step, in which a material of the at least one conductive layers 116, 118, which is then N-doped, is converted into a P-doped material, alternatively has its net N-doping concentration partly compensated by P-dopants, whereby its resistivity increases at least 100%. In particular, this is advantageous in case of the above described two-part conductive layers 116, 118, where a lower conductive layer 116 with relatively high N-doping is removed during the wet etch to leave an exposed upper conductive layer 118 with relatively low N-doping, and where it is the upper, low N-doped conductive layer 118 which is subjected to the diffusion step. The diffusion as such may take place in any suitable way.

The additional diffusion step is preferably performed before the second etching step, and in a particular example by providing a masked diffusion step prior to even etching the waveguide. Hence, the additional diffusion step may be performed as a part of the above-discussed material stack providing step. The Implant isolation can, for instance, be done after forming of the tunnel since the implant-induced defects might be annealed out during subsequent epi growths.

In particular, such a diffusion step may comprise converting the material of the upper conductive layer 116, 118 in question selectively, along the longitudinal direction L, so that at least one PN junction and at least one NP junction are formed along the waveguide 104 in the longitudinal direction L. Such combination of a PN and an NP junction will act as a double diode, effectively hindering electric current across both diodes in the longitudinal direction L, hence effecting electric isolation in the longitudinal direction L. In a particularly advantageous example, at least one PN junction and at least one NP junction are both formed along one and the same of said second longitudinal sections 102. This is schematically illustrated in FIG. 10.

In an alternative or supplementary embodiment, the method further comprises an isolating implant step, in which an implant is injected into, or in proximity of, the at least one conducting layers 116, 118, such that either crystal damage from the implant process or electrically contributed holes from the implanted atoms or compounds, increase the electric resistivity of at least part of the conductive layer 116, 118 in question.

Figure 1B:
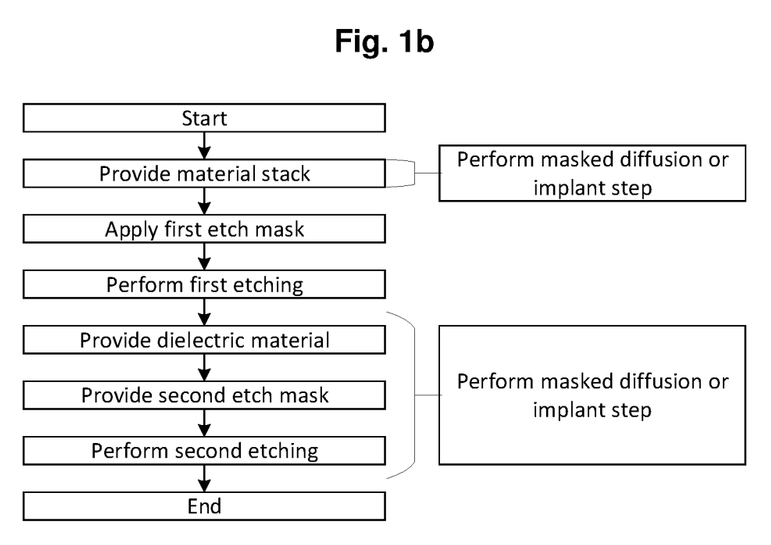
FIG. 1B is a flowchart similar to the one shown in FIG. 1A, but also illustrating a masked diffusion or implant step.

FIG. 1B illustrates method steps that are optionally additional to the steps shows in FIG. 1A, pertaining to said additional diffusion. Hence, in connection to the material stack provision step, the substrate may optionally be removed from a growth apparatus to do a masked diffusion or implant step, after some but not all of the material stack has been provided. Further, a masked diffusion or implant step may be performed at any point after the first etching step, such as immediately before or after the dielectric material provision step, the second etch mask provision step or the second etching step.

The present invention has turned out to be particularly advantageous in the case where the material stack 110 is provided using epitaxial growth, providing the waveguide 104 with optical propagation substantially in the (1 0 0) crystal plane of the grown InP material stack. In other words, the material stack 110 may comprise the set of parallel layers 111-121, each arranged in parallel to the (1 0 0) InP crystal plane. In such epitaxial layer stacks, it is difficult for known selective wet etchants (selected to etch away InP, but to terminate on InGaAsP) to propagate in the lateral W direction, since the wet etch terminates on etch stop planes, such as the (1 1 1) plane, in the crystal material, along which the wet etch proceeds very slowly or not at all.

The wet etching step is performed using a selective wet etchant, in other words a wet etchant arranged to etch away some materials more efficiently than others, or to etch away some materials but not others. For instance, a wet etchant arranged to etch InP material but not InGaAs or InGaAsP materials can be used. Examples include the wet etchant HCl:H3PO4.

Another possibility is to first employ FeCl3:H2O (1:2) to etch away an InAlAs etch-guiding layer, and as a result produce a lateral through tunnel with that layer, after this InAlAs layer has been exposed in the first etch step. This particular wet etchant also etches InGaAs but not InP, so areas of InGaAs that are not intended for removal would require masking. After the wet etch removal of an InAlAs etch guiding layer, for example HCl:H3PO4 could be employed to clear away the InP up to the tunnel ceiling and floor InGaAsP etch stops.

As opposed to the second etching step, the etching in the first etching step may be a dry etching, in which the waveguide 104 rib is formed using lithographic procedures.

As seen in the Figures, lower spacer layers 112, 114 may be used, forming part of the material stack 110, between the conductive layers 116, 118 and the substrate 111, such as on either or each side of a lower etch-stop layer 113.

Above, preferred embodiments have been described. However, it is apparent to the skilled person that many modifications can be made to the disclosed embodiments without departing from the basic idea of the invention.

For instance, the device 100 may comprise additional sub-components than the ones described above, depending on the particular application, and the method described herein may comprise additional steps, such as per se conventional pre- and post production steps.

Everything which has been said regarding the first exemplifying embodiment of the device 100 is equally relevant the second exemplifying device 200 and vice versa, as applicable.

Hence, the invention is not limited to the described embodiments, but can be varied within the scope of the enclosed claims.

What is claimed is:

1. A method of manufacturing an integrated semiconductor optical waveguiding device comprising an elongated waveguide in turn having a longitudinal, a lateral, and a height direction, which waveguiding device further comprises, in height order, a lower InP substrate layer with an electric resistivity of at least 10% that of undoped InP;

a conductive layer; and a waveguiding core layer, which conductive layer is doped so that it is provided with an electric conductivity that is at least 10 times higher than that of the substrate layer, and which conductive layer is arranged between the substrate layer and the waveguiding core layer, which method comprises the steps of:

a) providing a material stack, as a set of alloys in the InGaAsP/InP or InGaAlAs/InP material systems, and further comprising the substrate layer, the conductive layer and the waveguiding core layer, which conductive layer is made from a material which, due to its crystal properties and in relation to its crystal axes, is more easily wet etchable in certain directions than in other directions, and which conductive layer is arranged in relation to the material stack so that the conductive layer is more easily wet etchable in the height direction than in the lateral direction, which material stack further is provided to comprise, between the substrate layer and the waveguiding core layer, an etch-guiding layer made from a material which is more easily etchable in the lateral direction than the material of the conductive layer, and which material stack comprises InP material between the etch-guiding layer and the waveguiding core layer;

b) etching, in a first etching step, said material stack down to and including said waveguiding core layer, so that an elongated shape of the elongated waveguide is formed together with an etched area laterally beside the waveguide;

c) providing an etch mask material across the formed waveguide;

d) wet etching, in a second etching step, parts of said etched areas that are not protected by the etch mask, so that material of the etch-guiding layer as a result is removed across the lateral direction of the waveguide, forming a laterally extending through tunnel in the etch-guiding layer and in the conductive layer.

2. The method according to claim 1, wherein in step a) the material stack is provided so that it further comprises an upper cladding layer, arranged above the waveguiding core layer in the height direction.

3. The method according to claim 2, wherein in step a) the material stack is provided so that the upper cladding layer is P-doped or undoped.

4. The method according to claim 1, wherein in step a) the material stack is provided so that the conductive layer is N-doped.

5. The method according to claim 1, wherein in step a) the material stack is provided so that it further comprises an etch-stop layer, arranged between the etch-guiding layer and the waveguide core layer and in step d) defining an upper etch-stop surface for the wet etch of the conductive layer in the second etching step.

6. The method according to claim 5, wherein in step a) the material stack is provided so that the conductive layer comprises an upper conductive layer with lower N doping concentration and a lower conductive layer with higher N doping concentration, and so that the etch-stop surface is arranged between said upper and said lower conductive layers.

7. The method according to claim 6, wherein in step a) the material stack is provided so that the lower conductive layer is N-doped to at least $4\times10^{16}$ surplus electrons per $cm^3$.

8. The method according to claim 5, wherein in step a) the material stack is provided so that the etch-stop layer comprises InGaAs and/or InGaAsP.

9. The method according to claim 1, further comprising, after step b) and before step d), depositing a dielectric or photoresist material on the lateral sides of the waveguide so as to protect the lateral waveguide sides from being etched in step d).

10. The method according to claim 9, wherein the dielectric material is further provided laterally out from a side wall of said waveguide.

11. The method according to claim 1, wherein in step c) the etch mask is only provided along one or several first longitudinal sections along the waveguide, and not along second longitudinal sections along the waveguide, so that the tunnel is only formed along such second longitudinal sections.

12. The method according to claim 11, wherein said first and said second longitudinal sections are arranged in an alternating manner.

13. The method according to claim 11, wherein a second longitudinal section is longer, in the longitudinal direction, than an adjacently arranged first longitudinal section.

14. The method according to claim 6, wherein in step c) the etch mask is only provided along one or several first longitudinal sections along the waveguide, and not along second longitudinal sections along the waveguide, so that the tunnel is only formed along such second longitudinal sections, the method further comprising a diffusion step, in which a material of the upper conductive layer is converted into a P-doped material, alternatively has its net N doping concentration compensated by P-dopants, whereby its resistivity increases at least 100%.

15. The method according to claim 14, wherein the diffusion step comprises converting the material of the upper conductive layer selectively, so that at least one PN junction and at least one NP junction are formed along the waveguide in the longitudinal direction.

16. The method according to claim 15, wherein at least one PN junction and at least one NP junction are formed along one and the same of said second longitudinal sections.

17. The method according to claim 1, the method further comprising an insulating implant step, in which an implant is injected into, or in proximity of, the conductive layer, such that either crystal damage from the implant process or electrically contributed holes from the implanted atoms or compounds, increase the electric resistivity of at least part of the conductive layer.

18. The method according to claim 1, wherein in step a) the material stack is provided using epitaxial growth, providing the waveguide (104) with optical propagation substantially in the (1 0 0) crystal plane of the grown InGaAsP/InP or InGaAlAs/InP material stack.

19. The method according to claim 1, wherein in step d) the wet etch in the second etching step is performed using a selective wet etchant such as $HCl:H_3PO_4$.

20. The method according to claim 1, wherein in step b) the etching in the first etching step is a dry etching.

21. The method according to claim 1, wherein in step a) the material stack is provided so that the etch-stop layer is arranged at least 0.1 μm from the waveguiding core layer.

22. The method according to claim 1, wherein in step a) the material stack is provided so that the etch-stop layer is at the most 0.1 μm thick in the height direction.

23. The method according to claim 1, wherein in step a) the material stack is provided so that the etch-guiding layer comprises AlInAs and/or AlInAsP.

24. The method according to claim 1, wherein in step a) the material stack is provided so that the etch-guiding layer is at the most 0.2 μm thick in the height direction.

25. The method according to claim 1, wherein in step b), the etching stops before reaching said etch-guiding layer.

* * * * *